United States Patent [19]
Müller

[11] Patent Number: 4,632,032
[45] Date of Patent: Dec. 30, 1986

[54] ELECTRONIC IGNITION CONTROL CIRCUIT

[75] Inventor: Udo Müller, Nuremberg, Fed. Rep. of Germany

[73] Assignee: Diehl GmbH & Co, Nuremberg, Fed. Rep. of Germany

[21] Appl. No.: 681,924

[22] Filed: Dec. 14, 1984

[51] Int. Cl.[4] .............................................. F42C 11/00
[52] U.S. Cl. ..................................... 102/206; 102/218
[58] Field of Search ............... 102/206, 207, 208, 209, 102/210, 215, 218

[56] References Cited

U.S. PATENT DOCUMENTS

| | | |
|---|---|---|
| 3,548,749 | 12/1970 | Dreitzler . |
| 3,908,551 | 9/1975 | Dahl . |
| 3,952,660 | 4/1976 | Davis . |
| 4,119,038 | 10/1978 | Allen et al. .......................... 102/207 |
| 4,240,350 | 12/1980 | Münzel et al. ...................... 102/215 |
| 4,421,029 | 12/1983 | Wich .................................. 102/207 |
| 4,473,759 | 9/1984 | Mahabadi . |
| 4,493,259 | 1/1985 | Münzel ............................... 102/206 |

FOREIGN PATENT DOCUMENTS

| | | |
|---|---|---|
| 0008835 | 3/1980 | European Pat. Off. . |
| 0093804 | 11/1983 | European Pat. Off. . |
| 2608067 | 9/1977 | Fed. Rep. of Germany . |
| 2838055 | 3/1979 | Fed. Rep. of Germany . |
| 2750972 | 5/1979 | Fed. Rep. of Germany . |
| 3100506 | 12/1981 | Fed. Rep. of Germany . |
| 923523 | 4/1963 | United Kingdom . |
| 961201 | 6/1964 | United Kingdom . |
| 1536065 | 12/1978 | United Kingdom . |
| 2049892 | 12/1980 | United Kingdom . |

*Primary Examiner*—Charles T. Jordan
*Attorney, Agent, or Firm*—Scully, Scott, Murphy & Presser

[57] ABSTRACT

An electronic ignition control circuit, including a logic circuit which is powered from a power supply source, for the obtaining of an ignition clearance signal from a combination of ignition clearance signals from a combination of ignition sensor signals, and including an electrical detonator which is ignitable through the intermediary of a switching element which is electronically reversible responsive to the ignition signal.

5 Claims, 1 Drawing Figure

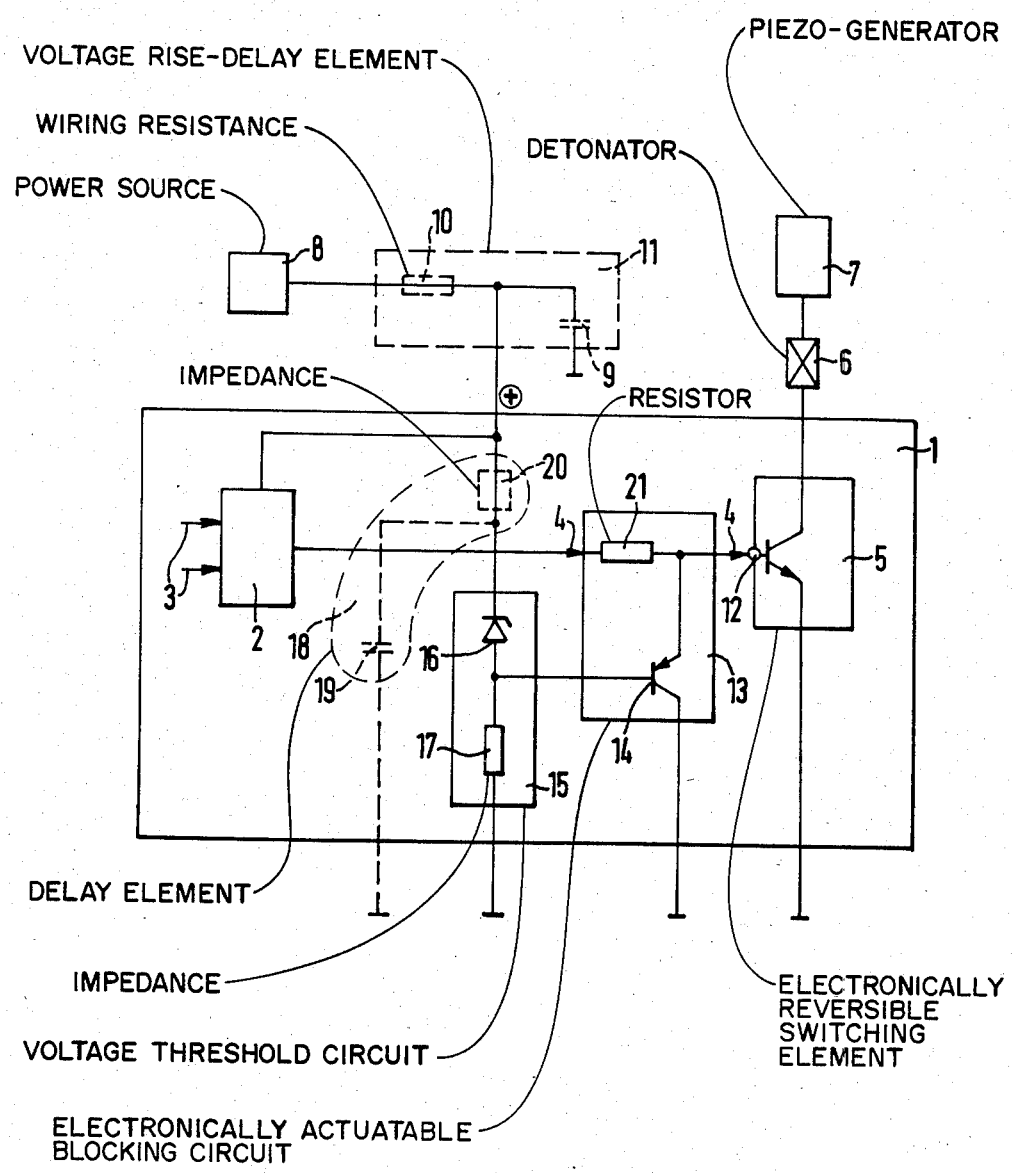

ELECTRONIC IGNITION CONTROL CIRCUIT

BACKGROUND OF THE INVENTION

1. Field of the Invention

The present invention relates to an electronic ignition control circuit, including a logic circuit which is powered from a power supply source, for the obtaining of an ignition clearance signal from a juncture of ignition sensor signals, and including an electrical detonator which is ignitable through the intermediary of a switching element which is electronically reversible responsive to the ignition release signal.

2. Discussion of the Prior Art

An ignition control circuit of that type has become known, for instance, from the disclosure of German Published Patent Application 26 08 067. Through the intermediary of this circuit, from a number of ignition sensor signals by means of their logic junction, there is obtainable an ignition signal for the current circuit through an electrical detonator.

It has been ascertained during the course of investigations that at particularly unfavorable boundary conditions, especially with regard to the begin of the functioning of the power supply source for the supplying of the logic circuit, which, for example, is built into a projectile and is first activatable upon firing, there are prematurely assumed transient conditions by the logic circuit; in effect, without the presence of the prerequisite junction criteria, which lead to the emission of output signals acting on the switching element as ignition signals. These non-controllable initial states of the logic circuit can occur for as long as the latter is not supplied with a minimal operating voltage for the orderly functioning of its junction or connecting components.

SUMMARY OF THE INVENTION

Accordingly, in recognition of this situation, it is an object of the present invention to equip an ignition control circuit of the above-mentioned type which is based on a logic combination of input signals, with a safety measure which is simple and operationally-reliable, easily testable and optionally correlatable with the applicable operating voltage conditions of the logic circuit, which reliably prevents such kinds of apparent ignition triggering signals, and thereby prevents any premature clearing of the electrical circuit across the detonator.

The foregoing object is inventively achieved in that the ignition control circuit of the above-mentioned type has an electronically controllable blocking circuit section connected ahead of a control input of the switching element, and which is blockable from the power supply source through a rated voltage-threshold circuit.

Inasmuch as an electronically controllable blocking circuit section is connected ahead of the switching element in the current circuit of the detonator for the (actual and especially premature, apparent) ignition clearance signals from the logic circuit, which is rendered ineffective through a threshold circuit, there can be ensured without any further measures that there will be prevented any kind of actuation of the switching element from the logic circuit, for as long as the output voltage of the power supply source, which is monitored by means of the threshold circuit, still lies below the voltage level which must be absolutely assured for the orderly functioning of the logic circuit as its minimal operating voltage. Required for the inventive protective measure are merely two non-linear divider circuits constituted of complementary transistors with a series-connected impedance ahead of the base of the switching element and a voltage dependently-connected threshold element with a shunt impedance connected ahead of the base of this shunt transistor.

Through an additional delay circuit at the input of this threshold element there is obtained a delayed release or clearance of the switching element for the detonator, and thereby a simply broadened applicability of the above-described protective measure from the standpoint of circuitry technology, in that there can be applied additional time fuses with respect to the earliest possible triggering time point of the detonator, such as concerning the barrel and input tube safety for a projectile, and which can be sized within large limits.

BRIEF DESCRIPTION OF THE DRAWING

Additional modifications and alternatives, as well as further features and advantage of invention, can be ascertained from the following detailed description on the basis of the schematically illustrated embodiment of the invention, taken in conjunction the single figure of the accompanying drawing which illustrates a block circuit diagram of an electronic ignition control circuit with the consideration given to the inventive protective measures in its implementation by means of bipolar transistors.

DETAILED DESCRIPTION

Referring in detail to the drawing, the electronic ignition control circuit 1 incorporates a logic circuit 2 in which there are combined ignition sensor signals 3 which are obtained, for example, by means of different receivers based on different physical effects; so as to generate an ignition signal 4 for the attacking of a target pursuant to the parameters of certain target criteria during the respective approach to a target object, and in which an electronically reversible switching element 5 renders an electrical detonator 6 live for the detonation of an active charge.

The detonator 6 can be powered from a current or voltage supply source which is correlated therewith, for example, by a piezo-generator 7 which is excited as the result of striking a target, or from a stationary active power source 8. In any event, for conducting the power supply to the logic circuit 2, there is provided a power source 8, which can constitute, for example, a firing-activatable battery; or a piezo-generator which is excited as a consequence of the firing acceleration of a projectile; or a thermogenerator excited by the heat of friction caused by the projectile flight; or an impeller generator.

In the utilization of practically all power sources 8 which come into consideration, there must always be determined that the stationary voltage will not suddenlike and at a controllable point in time point stand available from the beginning of its operation, but will build up more or less slowly. This is based, on the one hand, upon the physical manner of functioning of such a power source 8 and, moreover, in that effective at the output there are always leakage inductances 9 which, in conjunction with an internal or wiring resistance 10, provide the effect of a voltage rise-delay element 11.

In any event, at the logic circuit 2 there is available a supply voltage which is not obtained suddenlike from the power source 8, which lies above the minimal operating voltage, for which there is defined (controllably predeterminable) the logic function of the coupled together gates of the logic circuit 2. This signifies in the practice of utilizing those types of logic circuits 2, that resulting from the irregular behavior caused by preceding operation under a subvoltage, there will be encountered undefined initial states of the logic circuit 2 and thereby, from the ignition sensor input signals 3 there cannot be triggered unnecessary and inappropriate ignition triggering signals 4. However, this poses a safety risk in the handling of ammunition articles which are equipped with that type of ignition control circuit 1, inasmuch as the activation of the detonator 6 is transiently prematurely initiated.

In order to securely block an actuation of the detonator 6 through the reversing of the switching element 5, as long as there has not been at least reached the operating voltage for the controllable functioning of the logic circuit 2, connected ahead of the control input 12 of the switching element 5 is an electronically actuatable blocking circuit section 13, which will only then release or clear the actuating capability of the switching element 5 from the logic circuit 2, when it responds to reaching of the operating voltage for the logic circuit 2 from the power supply source 8.

Thereby, the release or clearing of the electrical ignition circuit through the detonator 6 is blocked for so long, and any kind of premature ignition securely prevented because of a premature apparent clearing signal 4 from the still not regularly operating logic circuit 2, until the logic circuit 2 functions controllably, inasmuch as it is supplied with an adequate operating voltage from the power supply source 8.

For reasons of the operational dependability of this protective measure, the blocking circuit section 13 is preferably not constituted as a circuit breaker, but as a non-linear voltage divider circuit with a shunt element 14 connected in parallel with the control input 12 of the switching element 5, which is self-conductive in the inoperative condition.

This electronic shunt element 14 is inverted from the power source 8 (which powers the logic circuit 2) through a rated voltage-threshold circuit 15, which will only activate at the reaching or exceeding of the rated operating voltage for the orderly functioning of the logic circuit 2. Provided as such a threshold circuit 15 there can be again simply a non-linear voltage divider which includes a component with a threshold characteristic, for example, a zener diode 16, in the series branch and in the parallel branch; in effect, in parallel with the actuation of the subsequently connected in blocking circuit section 13; such as an impedance 17. Only when, on the basis of the corresponding voltage rise from the power source 8, and therefore for the supply of the logic circuit 2, there is activated the zener diode 16 is a priori eliminated the shunting effect of the blocking circuit section 13, and thereby the control input 12 of the switching element is actuatable from the logic circuit 2.

In order to achieve a further protection against the premature actuation of the detonator 6; for example, a pretube safety in a projectile, the threshold circuit 15 need merely have a delay element 18 connected ahead thereof. This is shown in the drawing as a low-pass filter element of a parallel-connected capacitance 19 with a series impedance 20.

With particularly simple requirements from the standpoint of the circuitry technology and at a high degree of operational reliability, the inventive protective measure can be implemented through an ignition control circuit 1, when the switching element 5 is connected in series with the detonator 6, and the switching element 5 as well as the shunt element 14 are constructed as complementary transistors (in the circuit for a positive operating voltage from the power supply source 8 produced with bipolar transistors). There is constantly applied the collector potential (prior to the presence of an adequate voltage for the actuation of the threshold circuit 15 which is designed for the minimum operating voltage of the logic circuit 2) to the base of the shunt element 14 across the impedance 17; in effect, the shunt element 14 is reliably conductive. As a result, the control input 12 is short-circuited, the switching element 5 is thus reliably blocked, and can also not be actuated through any parasitic output signals from the logic circuit 2 across the protective resistor 21. First at the high-ohmic collector-emitter section of the shunt element 14, due to the actuated zener diode 16 at a sufficiently high operating voltage from the power source 8, is there eliminated the shunt short-circuit from the control input 12, and the switching element 5 can now be reversed by an ignition signal 4 which is emitted from the logic circuit 2 into a state of preparedness for detonation (current-circuit through the detonator 6).

What is claimed is:

1. In an electronic ignition control circuit including a logic circuit powered by a power supply source for obtaining an ignition signal from a combination of ignition sensor signals; an electrical detonator means; and a switching element electronically switched by the ignition signal for clearing said detonator means; the improvement comprising: an electronically actuatable blocking circuit section connected ahead of a control input of said switching element; said blocking circuit section including a self-conductive shunt element connected in parallel with the control input of the switching element; and a rated voltage-threshold circuit for blocking the control input from the power supply source.

2. An electronic ignition control circuit as claimed in claim 1, wherein the shunting blocking circuit section is connected in parallel with the control input of said switching element, and is connected in series with the detonator means.

3. An electronic ignition control circuit as claimed in claim 1, wherein the rated voltage-threshold circuit which is connected with the output of the power supply source includes a voltage divider with a series impedance formed by a zener diode for the blocking circuit section.

4. An electronic ignition control circuit as claimed in claim 1, wherein the switching element and the blocking circuit section include mutually complementary transistors.

5. An electronic ignition control circuit as claimed in claim 1, wherein an additional protective delay element is connected between the threshold circuit and the logic circuit at the output of the power supply source.

* * * * *